(12) United States Patent
Sato et al.

(10) Patent No.: US 7,731,764 B2
(45) Date of Patent: Jun. 8, 2010

(54) SINGULATION METAL MOLD AND METHOD FOR PRODUCING SEMICONDUCTOR DEVICE

(75) Inventors: Takumi Sato, Hitachi (JP); Aki Suzuki, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 223 days.

(21) Appl. No.: 11/954,528

(22) Filed: Dec. 12, 2007

(65) Prior Publication Data

US 2008/0148540 A1 Jun. 26, 2008

(30) Foreign Application Priority Data

Dec. 13, 2006 (JP) .............................. 2006-336275

(51) Int. Cl.
 *H01L 21/67* (2006.01)
(52) U.S. Cl. ..................... 29/25.01; 438/106
(58) Field of Classification Search .................. 438/106; 29/25.01
See application file for complete search history.

(56) References Cited

U.S. PATENT DOCUMENTS 5,052,606 A * 10/1991 Cipolla et al. ............... 226/120

6,297,074 B1 * 10/2001 Miyano et al. .............. 438/109

FOREIGN PATENT DOCUMENTS

JP 01-183830 7/1989

* cited by examiner

*Primary Examiner*—Charles D Garber
*Assistant Examiner*—Stanetta D Issac
(74) *Attorney, Agent, or Firm*—Scully, Scott, Murphy & Presser, P.C.

(57) ABSTRACT

A singulation metal mold for singulating a plurality of semiconductor devices arrayed on a TAB tape has a punch as an upper metal mold of the singulation metal mold, a die block as a lower metal mold of the singulation metal mold, a knockout disposed to be slidable vertically inside a vertical hole formed in the die block, the knockout being operable to press up above the die block each of the singulated semiconductor devices left on the die block after the singulating, a press-up plate positioned under the knockout to support the knockout and linked mechanically to the knockout, and being operable to forcibly move the knockout vertically when the press-up plate moves vertically; and a press-up plate descent forcing mechanism that is operable to forcibly pull down the press-up plate.

3 Claims, 5 Drawing Sheets

FIG.7

SINGULATION METAL MOLD AND METHOD FOR PRODUCING SEMICONDUCTOR DEVICE

The present application is based on Japanese patent application No. 2006-336275 filed on Dec. 13, 2006, the entire contents of which are incorporated herein by reference.

BACKGROUND OF THE INVENTION

1. Field of the Invention

The invention relates to a singulation metal mold used for producing a semiconductor device packaged in a package such as BGA (Ball Grid Array) which is thin and compact and has outer dimensions close to that of a semiconductor chip, and a method for producing the semiconductor device including a singulation step by using the singulation metal mold. Herein "singulation" means dividing or cutting a base film or tape on which plural semiconductor chips are mounted into pieces on each of which the single semiconductor chip is mounted.

2. Description of the Related Art

Heretofore, a TAB (Tape Automated Bonding) system is used to produce such type of a semiconductor device for improving the productivity.

Figure 4:
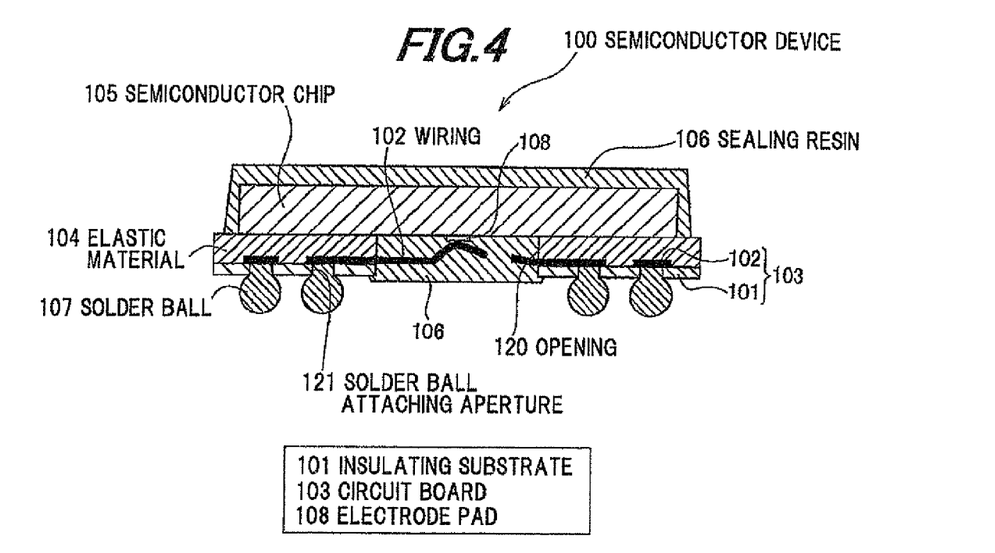
FIG. 4 is a cross sectional view showing an example of a semiconductor device having the package structure of the BGA or CSP system fabricated in accordance with a TAB system.

FIG. 4 shows an example of a semiconductor device having a mounting structure in BGA or CSP (Chip Size Package) system. The semiconductor device 100 is constructed such that a wiring 102 is formed on the surface of an insulating substrate 101 with an opening 120 where a circuit board 103 is composed of the 101 and 102, and a semiconductor chip 105 is mounted on the circuit board 103 through an elastic material 104. Furthermore, the whole circumference of the semiconductor chip 105 and the opening 120 as a space housing an electrode pad 108 is sealed with a sealing resin 106 by transfer molding.

In detail, the wiring board 103 is arranged such that apertures 121 for attaching solder balls 107 for external connection are defined on the lengthy insulating substrate 101 called also a carrier tape, and the wiring 102 is formed by photo-etching a copper foil which is previously laminated on a surface for mounting the semiconductor chip 105. The solder balls 107 are attached to the back surface opposite to the surface for mounting the semiconductor chip 105.

The semiconductor chip 105 is mounted on the circuit board 103 through the elastic material 104, and the electrode pad 108 disposed on the bottom of the semiconductor chip 105 is connected to the wiring 102, whereby the electrical connection is made therebetween.

The plural semiconductor devices 100 arrayed and formed on the single continuous and lengthy carrier tape according to the TAB system as described above need to be finally separated into single chip-mounted packages. Namely, it is necessary to conduct a singulation step for singulating the semiconductor devices 100 on the carrier tape (insulating substrate 101).

Figure 5A:
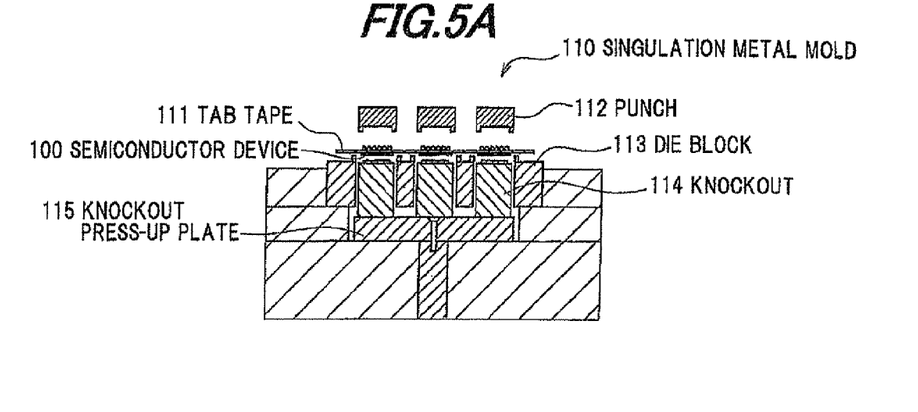
FIGS. 5A, 5B, and 5C are cross sectional views showing singulating steps and singulation metal molds used therefor in a conventional method for producing a semiconductor device.
Figure 5B:
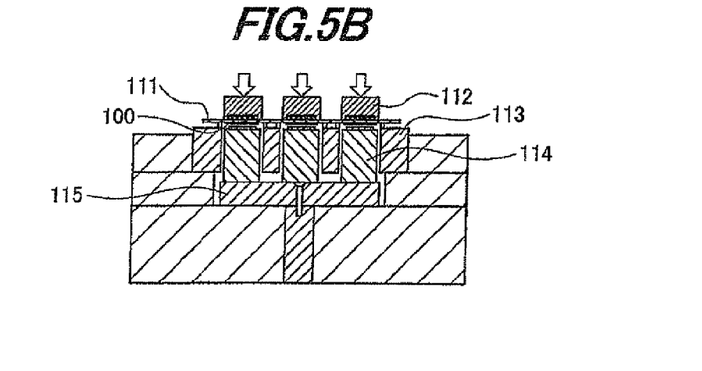
Figure 5C:
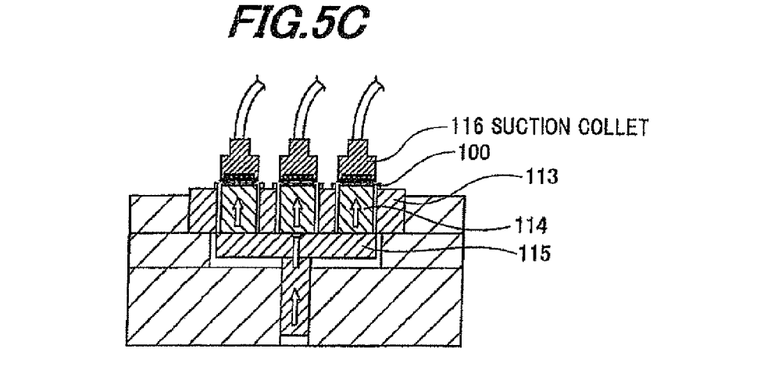

FIGS. 5A to 5C are cross sectional views showing steps for singulating semiconductor devices as described above and the singulation metal mold used therefor.

In the singulating steps, at first, as shown in FIG. 5A, a TAB tape 111 with the semiconductor devices 100 sealed but not separated into the respective pieces is mounted on a singulation metal mold 110.

Then, as shown in FIG. 5B, punches 112 as a upper metal mold of the singulation metal mold 110 descend to sandwich the semiconductor devices 100, which are arrayed and formed at predetermined regions on the TAB tape, between the punches 112 and a die block 113, and, while engaging the punches 112 with the die block 113 as a lower metal mold, a predetermined pressure is applied thereon by press work. Thus, the insulating substrate 101, the elastic material 104, the sealing resin 106 and, optionally, a plating electric current supplying extension line (not shown) for the wiring 102 are punched simultaneously. As a result of the punching, the respective semiconductor devices 100 are separated one another as so-called individual piece.

Here, the respective semiconductor devices 100 are left on a knockout 114 inside the die block 113. Then, the knockout 114 located on a knockout press-up plate 115 is pressed up by elevating the knockout press-up plate 115 as shown in FIG. 5C, so that the semiconductor devices 100 left on the surface of the knockout 114 are disposed higher than the upper surface of the die block 113. In this state, a suction collet 116 is brought close to the semiconductor device 100 from above, and the semiconductor 100 is picked up by applying suction force by air pressure (negative pressure).

When the pick-up work is completed, the knockout press-up plate 115 is moved down by an actuator (not shown) such as an air cylinder disposed outside the singulation metal mold 110. Thus, since nothing supports the knockout 14, the knockout 114 freely falls with its own weight to return to a regular low position. Alternatively, as a power source for pressing up the knockout 114, spring force is proposed instead of the air cylinder (See JP-A-H01-183830).

However, irrespective of which types of the power source is used to press up the knockout 114, a very thin and fine chip of the sealing resin etc. may be produced unavoidably during the singulation, where the chip can penetrate the clearance between the knockout 114 and the die block 113 to clog it.

Figure 6A:
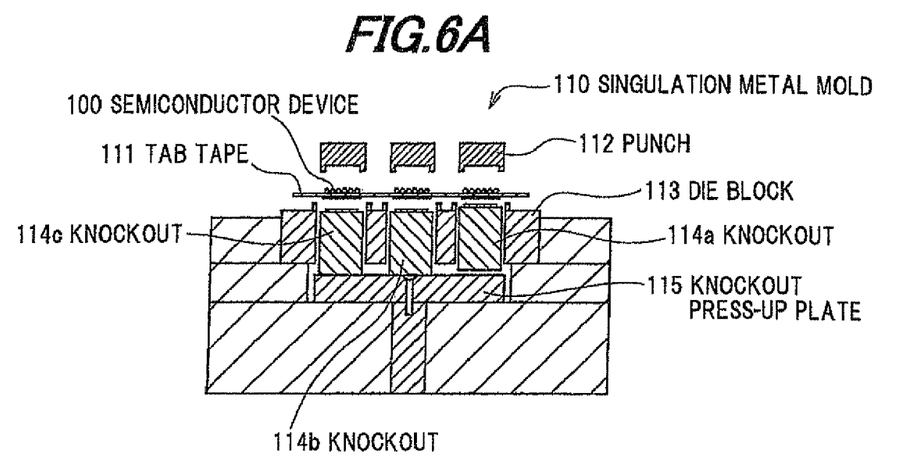
FIGS. 6A and 6B are cross sectional views showing schematically an example of a condition wherein the failure of descending a knockout arises during a conventional producing process of a semiconductor device.

In the chip-clogged state, the smooth vertical movement of the knockout 114 in the die block 113 is highly disturbed. Thus, as shown in FIG. 6A, the knockouts 114b and 114c being normally movable in the vertical direction freely falls down to a normal low position, and only the knockout 114a which cannot be smoothly moved due to the clogging with the chip 117 is left at an upper position.

Figure 6B:
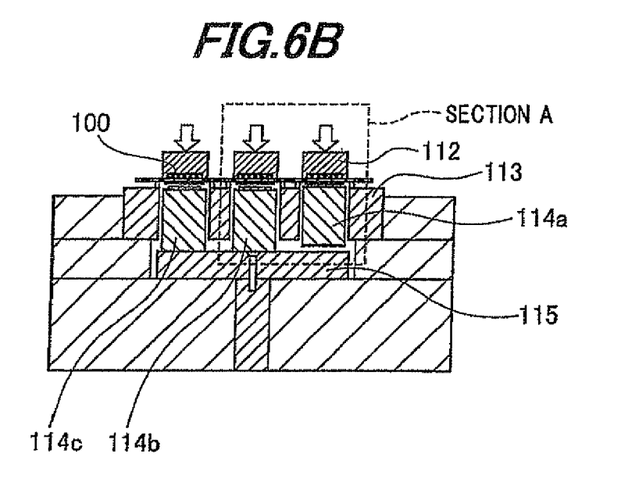
Figure 7:
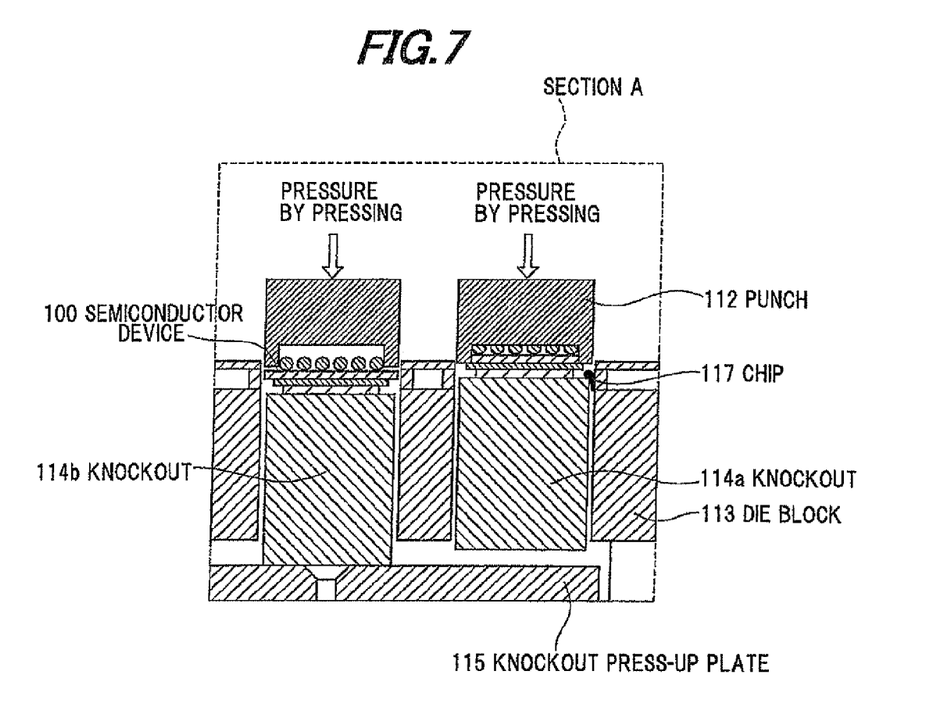
FIG. 7 is an enlarged cross sectional view showing the knockout in the descending failure and the adjacent normal knockout in FIG. 6 picked out partially.

When the singulation is conducted under the above conditions, as shown in FIG. 6B and FIG. 7 which is an enlarged cross sectional view of FIG. 6B, while the semiconductor device 100 is clamped between the punch 112 and the knockout 114a, an excessive pressure will be applied to the semiconductor device 100. When the excessive pressure is applied thereto, the serious defect in the semiconductor device 100 as a target product is more likely to occur. Namely, cracks may be caused on the outer shell (the sealing resin 106 and the like) of a mounting package of the semiconductor device 100, or the breakage or serious damage of the semiconductor chip 105 may be caused inside the sealing resin 106.

Under the circumstances, it may be considered that such a minute dimension that the chip 117 cannot absolutely intrude into a clearance between the knockout 114 and the die block 113 is adopted in order to avoid the clogging with the chip 117. In fact, however, it is required that the clearance between the knockout 114 and the die block 113 is at least 0.5 mm, or more in order to assure the smooth vertical movements of the knockout 114. Consequently, it is extremely difficult or impossible to avoid the incidence of clogging with the thin chip 117 of 0.5 mm or less, and further it makes more difficult to overcome the problem of the incidence of serious defects in the semiconductor device 100 in the singulating step.

As mentioned above, in the conventional singulation metal mold and the conventional method for producing the semiconductor device using the singulation metal mold by the conventional TAB system, there is the problem that the breakage, damage or the like of the semiconductor device may be caused by a failure in the free fall of the knockout inside the metal mold during the singulation. It is very difficult to solve the above problem.

SUMMARY OF THE INVENTION

Accordingly, it is an object of the invention to provide a singulation metal mold and a method for producing a semiconductor device that can allow the singulation in high reliability and high productivity.

(1) According to one embodiment of the invention, a singulation metal mold for singulating a plurality of semiconductor devices arrayed on a TAB tape, the singulation being conducted such that the TAB tape with the semiconductor devices arrayed thereon is disposed between a punch as an upper metal mold of the singulation metal mold and a die block as a lower metal mold of the singulation metal mold, a predetermined pressure is applied onto the singulation metal mold while the punch is engaged with the die block comprises:

a knockout disposed to be slidable vertically inside a vertical hole formed in the die block, the knockout being operable to press up above the die block each of the singulated semiconductor devices left on the die block after the singulating;

a press-up plate positioned under the knockout to support the knockout and linked mechanically to the knockout, and being operable to forcibly move the knockout vertically when the press-up plate moves vertically; and a press-up plate descent forcing mechanism that is operable to forcibly pull down the press-up plate.

(2) According to another embodiment of the invention, a method for producing a semiconductor device by singulating a plurality of semiconductor devices arrayed on a TAB tape by using a singulation metal mold comprises:

disposing the TAB tape with the semiconductor devices arrayed thereon between a punch as an upper metal mold of the singulation metal mold and a die block as a lower metal mold of the singulation metal mold; and applying a predetermined pressure onto the singulation metal mold while the punch is engaged with the die block, wherein the singulation metal mold comprises, a knockout disposed to be slidable vertically inside a vertical hole formed in the die block, the knockout being operable to press up above the die block each of the singulated semiconductor devices left on the die block after the singulating, a press-up plate positioned under the knockout to support the knockout and linked mechanically to the knockout, and being operable to forcibly move the knockout vertically when the press-up plate moves vertically, and a press-up plate descent forcing mechanism that is operable to forcibly pull down the press-up plate.

(3) According to another embodiment of the invention, a singulation metal mold for singulating a plurality of semiconductor devices arrayed on a TAB tape comprises:

a punch as an upper metal mold of the singulation metal mold;

a die block as a lower metal mold of the singulation metal mold;

a knockout disposed to be slidable vertically inside a vertical hole formed in the die block, the knockout being operable to press up above the die block each of the singulated semiconductor devices left on the die block after the singulating;

a press-up plate positioned under the knockout to support the knockout and linked mechanically to the knockout, and being operable to forcibly move the knockout vertically when the press-up plate moves vertically; and a press-up plate descent forcing mechanism that is operable to forcibly pull down the press-up plate.

Advantages of the Embodiments

The singulation metal mold or the method for producing a semiconductor device of the embodiments is constructed of the press-up plate adapted to forcibly move the knockout vertically according as the press-up plate moves vertically; and the press-up plate descent forcing mechanism adapted to forcibly pull the press-up plate down, where the press-up plate down is forcibly pulled down after the singulation is completed, so that the knockout linked to the press-up plate can be also forcibly pulled down. Even if the clearance between the knockout and the die block is clogged with the chip, the knockout can be forcibly pulled down although it may be otherwise left at a high position due to being chip-clogged. Thus, the breakage or damage of the semiconductor device can be prevented during the singulation process, so that a semiconductor device can be provided that allows the singulation in high reliability and high productivity.

BRIEF DESCRIPTION OF THE DRAWINGS

The invention will be explained in more detail in conjunction with appended drawings, wherein.

DESCRIPTION OF THE PREFERRED EMBODIMENTS

A singulation metal mold and a method for producing a semiconductor device by using the singulation metal mold according to the preferred exemplary embodiment of the invention will be described below referring to the appended drawings.

Figure 1:
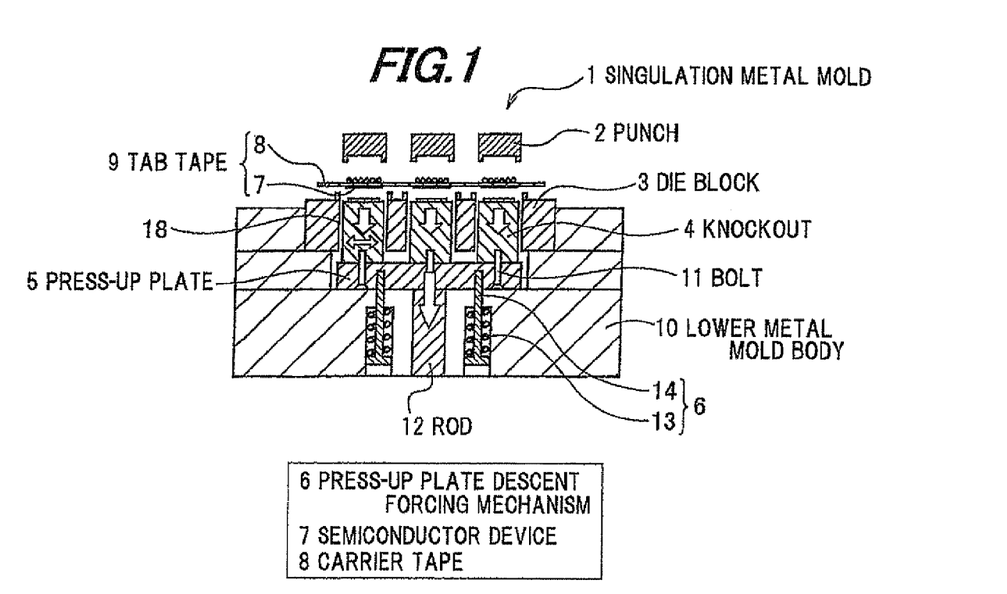
FIG. 1 is a cross sectional view showing the constitution of the principal part of the singulation metal mold according to a preferred embodiment of the invention.

FIG. 1 is a cross sectional view showing the constitution of the principal part of the singulation metal mold according to the exemplary embodiment.

Figure 2:
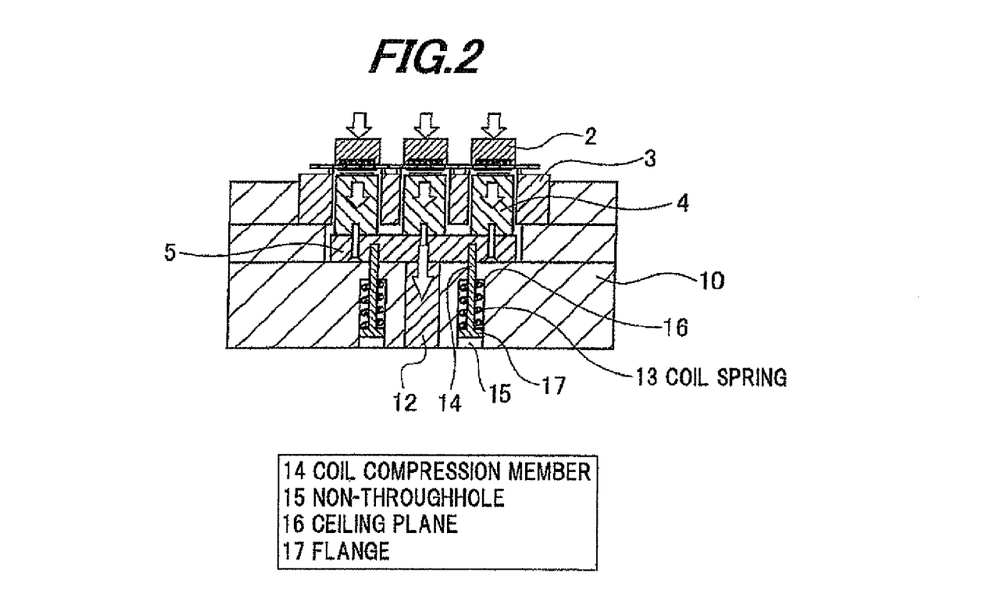
FIG. 2 is a cross sectional view showing a step wherein a TAB tape is mounted on the singulation metal mold shown in FIG. 1 to conduct a singulating operation.

FIG. 2 is a cross sectional view showing a step wherein a TAB tape is mounted on the singulation metal mold shown in FIG. 1 to conduct a singulating operation.

Figure 3:
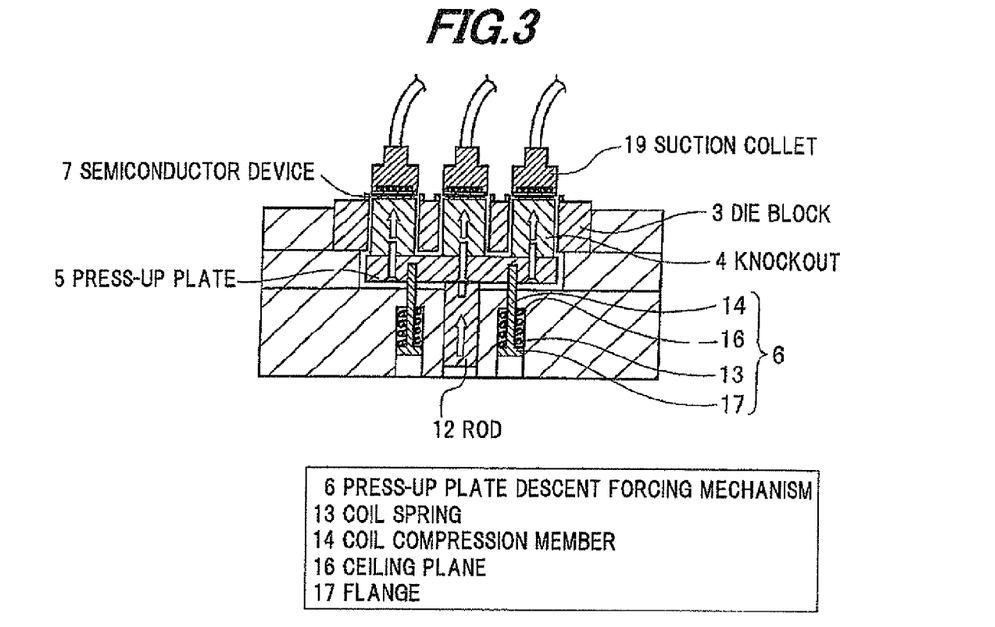
FIG. 3 is a cross sectional view showing a step for picking up semiconductor devices isolated from one another as individual products by means of a suction collet after completing the singulating operation.

FIG. 3 is a cross sectional view showing a step for picking up semiconductor devices isolated from one another as individual products by means of a suction collet after completing the singulating operation.

The singulation metal mold 1 of the exemplary embodiment includes the principal part composed of punches 2 being a so-called upper metal mold, a die block 3 being the essential part of a so-called lower metal mold, knockouts 4, a press-up plate 5, and a press-up plate descent forcing mechanism 6.

Onto the singulation metal mold 1, a TAB tape 9 wherein a plurality of semiconductor devices 7 are arrayed and formed on a carrier tape 8 is mounted, the individual semiconductor devices 7 arrayed and formed in the TAB tape 9 are subjected to so-called singulation to isolate these individual semiconductor devices from one another to be individual pieces, whereby the semiconductor devices 7 are obtained as substantive individual products.

Each of the punches 2 functioning as the upper metal mold is opposed to the die block 3 being the essential part of the lower metal mold so as to sandwich each of the semiconductor devices 7 being the working target. The punches 2 are engaged with the opposed die block 3; and when a predetermined pressure is applied to the punches 2, the individual semiconductor devices 7 are singulated from the TAB tape 9. In this case, the punches 2 themselves may be a common means.

The die block 3 is opposed as the essential part of the lower metal mold to the punches 2 being the upper metal molds so as to sandwich the semiconductor devices 7 being the working targets between the die block 3 and the punches 2. When the predetermined pressure is applied to the die block 3, the die block 3 is engaged with the opposed punches 2, whereby the individual semiconductor devices 7 are singulated from the TAB tape 9. In this case, the die block 3 itself may also be a common means. The die block 3 is linked mechanically to a lower metal mold body 10 positioned under the die block 3.

The knockouts 4 are arranged in such that they may be moved smoothly through vertical holes 18 formed so as to vertically pass through the die block 3 in the vertical direction; and that they may press up the semiconductor devices 7, in a condition wherein these semiconductor devices are left on the die block 3 as respective individual pieces after completing the singulating operation, to be upper than the upper surface of the die block 3.

The bottom surfaces of the knockouts 4 are supported by the upper surface of the press-up plate 5, and the knockouts 4 are mechanically linked to the press-up plate 5 by fastening with bolts 11, respectively.

The specific manner of the linkage may be practiced by a variety of means.

For instance, as shown in FIGS. 1, 2, and 3, it may be arranged in such that the lower parts of the knockouts 4 are detachably fixed to the upper surface of the press-up plate 5 by fastening the bolts 11 reaching screw grooves which are tapping-shaped to the lower part of the knockouts 4 through the press-up plate 5. Otherwise, it may be arranged in such that the lower surfaces of the knockouts 4 are fixed semipermanently to the upper surface of the press-up plate 5 by means of welding (not shown).

A so-called clearance between the knockout 4 and the vertical hole 18 of the die block 3 is selected to be 0.5 mm or more in order to be slidable vertically the knockout 4 in the vertical hole 18 of the die block 3. This is because it is usually required to have at least 0.5 mm, or more of clearance in order that the knockout 4 may be moved smoothly in the vertical hole 18 of the die block 3 along the vertical direction thereof. If the clearance is smaller than that described above, there is such tendency that the smooth vertical movements of the knockout 4 are remarkably impeded.

The press-up plate 5 is positioned under the lower part of the above-described knockouts 4, and these knockouts 4 are supported mechanically by the press-up plate 5. In addition, the press-up plate 5 is linked mechanically to the knockouts 4 by fastening means with the bolts 11 and the like, or a fixing means as mentioned above. It is further arranged in such that when the press-up plate 5 is vertically moved, the knockouts 4 are forcibly moved integral with the press-up plate 5 in the vertical direction. Consequently, when the press-up plate 5 is pulled back downwards, the knockouts 4 linked to the press-up plate 5 are also forcibly pulled back downwards integral (a so-called "interlocked") with each other. On the other hand, when the press-up plate 5 is pressed up upwards, the knockouts 4 linked to the press-up plate 5 are forcibly pressed up upwards integral (interlocked) with each other.

Onto the central portion in the lower surface of the press-up plate 5, a rod 12 is linked. The rod 12 is adapted to be vertically movable by means of an actuator (not shown) such as an air cylinder provided outside the rod. Consequently, the press-up plate 5 is adapted to be movable vertically together with the vertical movement of the rod 12 powered by the movement of an external actuator or the like (not shown).

The press-up plate descent forcing mechanism 6 is provided as a knockout forcibly descending means which functions to forcibly pull back downwards the press-up plate 5 by means of the repulsive force of a coil spring 13, thereby to forcibly descend downwards the knockout 4 linked to the press-up plate 5.

The press-up plate descent forcing mechanism 6 is provided with the coil spring 13 and a spring compression member 14 as the principal components.

The upper end portion extending in a rod-like fashion of the spring compression member 14 is linked to the lower surface side of the press-up plate 5, and a flange 17 provided on the lower end of the spring compression member 14 is arranged in such that the lower end of the coil spring 13 may be compressed upwards.

Each of the coil springs 13 is placed in the lower metal mold body 10 in such that the upper end thereof is held down downwards by a ceiling plane 16 of a non-throughhole 15 provided inside the lower metal mold body 10, and at the same time, the lower end thereof is pushed up upwards by the upper surface of the flange 17 being the lower end of the spring compression member 14.

Accordingly, in the press-up plate descent forcing mechanism 6, the coil spring 13 is in a state wherein it extends substantially perfect up to its normal length or the very close state in the case that the press-up plate 5 descends as shown in FIGS. 1 and 2, so that such repulsive force directing from a compressed state to an extended state is small. On the other hand, since a distance between the ceiling plane 16 of the non-throughhole 15 provided inside the lower metal mold body 10 and the upper surface of the flange 17 being the lower end of the spring compression member 14 becomes shorter in the case that the press-up plate 5 ascends as shown in FIG. 3, a strong repulsive force is accumulated in the coil spring 13 in a compressed state existing between the ceiling plane 16 of the non-throughhole 15 and the upper surface of the flange 17. The repulsive force accumulated in the coil spring 13 comes to be an enforcement force for descending forcibly downwards the press-up plate 5 and the knockouts 4 linked thereto.

The enforcement force for descending the press-up plate 5 derived from the repulsive force of the coil spring 13 as the motive power is retained in a condition wherein it is accumulated in the coil spring 13 so far as the press-up plate 5 is in an ascending state, so that the enforcement force continues to act always in the direction wherein the press-up plate 5 is allowed to come down downwards.

Consequently, each of the semiconductor devices 7 is picked up by the use of each of suction collets 19 or the like manner as shown in FIG. 3, thereafter, when the force towards the upper direction applied continuously to the rod 12 by means of an actuator such as an external air cylinder (not shown) is gradually released, the repulsive force of the coil spring 13 which has been accumulated up to that time is released, so that the press-up plate 5 is allowed to come down downwards due to the repulsive force. As a result, the knockouts 4 linked to the press-up plate 5 are also forcibly drawn down downwards in association (interlocked) with the press-up plate 5.

As described above, the knockouts 4 can be forcibly pulled back downwards by using the strong repulsive force accumulated in the coil springs 13. Accordingly, the occurrence of the failure in a descending operation of the knockout 4 due to the clogging of a sealing resin or the like in the clearance between the knockout 4 and the press-up plate 5 can be avoided. In addition, a possible problem of the breakage, damage or the like of the semiconductor device 7 arisen at the time of applying a pressure due to such failure in the descending operation of the knockout 4 as described above can be eliminated.

Furthermore, since the clearance between the knockout 4 and a vertical hole 18 of the die block 3 is selected to be a sufficient dimension of 0.5 mm or more without a fear of the occurrence of the failure in the descending operation of the knockout 4 due to the clogging of chips as described above, there is also such an advantage that the smooth vertical movement of the knockout 4 becomes possible to assure more easily and positively.

Moreover, since it is arranged in such that the knockout 4 is forcibly moved downwards by using the repulsive force of the coil spring 13, the repulsive force of the coil spring 13 functions always to forcibly pull down the knockout 4 downwards so far as the knockout 4 exists in a higher level than that of the die block 3. Consequently, there is also such an advantage that the occurrence of the failure in the descending operation of the knockout 4 due to the clogging of chips can be overcome more positively as compared with the case where the force for pulling down the knockout 4 downwards is applied in only the event of requiring a descending operation.

In the following, a method for producing a semiconductor device including a singulating step wherein the singulation metal mold as described above is used will be described, and particularly the singulating step will be principally described.

First, as shown in FIG. 1, the TAB tape 9 is mounted on the singulation metal mold 1 at a predetermined position.

Then, as shown in FIG. 2, each of the punches 2 being the upper metal molds are pulled down; and the punches 2 are opposed to the die block 3 so as to sandwich the whole of the respective semiconductor devices 7 therebetween without pressing each part of the main body of the semiconductor devices 7 which is not required to be cut out by the both of the punches and the die block. In these circumstances, a predetermined pressure is applied to the engaged punches 2 and the die block 3 to punch out the carrier tape 8 being an insulating substrate, an elastic material, a sealing resin and the like at the same time (not shown in FIGS. 1, 2, and 3), whereby the individual semiconductor devices 7 are isolated as individual pieces.

After the singulation, the individual semiconductor devices 7 isolated as individual pieces are in a state that they remain on the respective knockouts 4 in the die block 3.

Then, when the rod 12 is pushed up upwards by means of the movement of an external air cylinder (not shown) or the like as shown in FIG. 3, the press-up plate 5 is pushed up upwards by means of the movement of the rod 12, so that the knockouts 4 linked to the press-up plate 5 are also pushed UP upwards. As a consequence, the individual semiconductor devices 7 remain on the upper surfaces of the knockouts are also lifted up above the die block 3. On one hand, the coil springs 13 of the press-up plate descent forcing mechanism 6 come to be in a compressed condition by means of the lifting motion of the press-up plate 5, so that the repulsive force proportional to compression is accumulated in the coil springs 13.

The semiconductor devices 7 thus held up are picked up by means of, for example, suction collets 19 or the like.

Thereafter, the press-up plate 5 is pulled down by means of an external actuator such as an air cylinder (not shown). At that time, since the repulsive force accumulated heretofore in the coil springs 3 of the press-up plate descent forcing mechanism 6 is released, the press-up plate 5 is forcibly pulled down by means of the repulsive force to be returned to a predetermined lower position.

The singulation is conducted as described above, then, the semiconductor devices isolated as individual pieces are picked up, and the knockouts 4 are returned forcibly to a predetermined lower position. Thereafter, the following semiconductor devices 7 are mounted on the singulation metal mold in order to conduct the following singulation operation.

According to the singulation metal mold and the method for producing a semiconductor device using the singulation metal mold of the exemplary embodiment, such a problem that a breakage, a damage and the like arise on the semiconductor device fabricated in the case that there is a failure in the descending operation of the knockouts 4 in the singulating step can be eliminated as described above, whereby a highly reliable singulation can be realized in a high productivity, resulting in that it becomes possible to stably manufacture a highly reliable semiconductor device in a high productivity.

EXAMPLE

A TAB tape on which a number of semiconductor devices are formed and packaged with the use of a sealing resin is singulated by using the singulation metal mold as described in the above-described exemplary embodiment to fabricate a semiconductor device having a BGA package structure as shown in FIG. 4 as an example.

Specifically, the outline dimension of the semiconductor device is such that length: 14 mm, and width: 11 mm wherein a polyimide tape having a thickness of about 0.05 mm is used together with an elastic material having a thickness of about 0.15 mm and made of an epoxy base resin as an insulating substrate.

A spacing of 0.5 mm is maintained as the clearance between the knockout 4 and the vertical hole 18 of the die block 3.

Then, the many semiconductor devices formed on the TAB tape are singulated into each piece of the individual pieces by the use of the singulated metal mold according to the invention as described above.

As a result, the occurrence of failure in the descending operation of the knockouts in the singulation metal mold 1 is overcome, whereby no breakage or damage is observed in the semiconductor devices obtained as a result of isolation of them as individual pieces.

In the above-described exemplary embodiment and example, although the case wherein coil springs are used as a practical mode of the principal part of the press-up plate descent forcing mechanism is described, the invention is not restricted thereto as a matter of course. Other than that described above, it is possible to use also an air cylinder having a sufficiently high impetus by which knockouts can be positively moved in, for example, both ascending and descending directions; or a control means having an electro-mechanical power of source such as an electric motor.

However, the actuator using an air cylinder can usually output a considerably high power in the movement towards a stretching side (the upper movement described as to the rod 12 and the knockout 4) by using the compressed air of a high pressure. On the other hand, as to the movement towards a retracting side, there are many cases that the compressed air accumulated in the air cylinder is released up to atmospheric pressure, because of such reason that the whole constitution of an equipment system and the controlling method therefor are intended to make simple, or the like reasons. In this case, however, it is not easy to obtain such a strong compelling force that the knockout 4 in an undescended state due to clogging of chips is positively and effectively pulled down downwards in comparison with the case that the coil spring 13 is used as described in the above exemplary embodiment. When an electromechanical power of source is used, there may be such a fear that the whole constitution of the mechanism of the press-up plate descent forcing mechanism 6 which uses the electromechanical power of source becomes complicated as compared with the case that the coil spring 13 is used as described in the above exemplary embodiment. From the viewpoints as described above, it may be said that the use of the repulsive force of an elastic body such as the coil spring 13 is the most desirable. However, it is to be noted that any of the concerned matters and the fears as described above does not directly relate to the effect of the "elimination of the failure in the descending operation of a knockout" which is the problem itself to be solved by the invention, but relates to subordinate matters after all. Accordingly, it is possible to constitute the press-up plate descent forcing mechanism 6 by the use of an air cylinder or an actuator having an electromechanical source of power, as a matter of course, so far as the target means has a constitution by which the above-described concerned matters and fears can be overcome.

In the above-described exemplary embodiment and example, although the case wherein the invention is applied to the singulation of a TAB tape is described, other than that described, the invention is also applicable in the singulating step to such a case that a plurality of the semiconductor devices as shown in FIG. 4 are formed on not a long sheet-(belt)-like substrate, but, for example, a flexible substrate having the rectangular outer shape, and then, the substrate is singulated to obtain the individual semiconductor devices as individual pieces, as a matter of course.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method for producing a semiconductor device by singulating a plurality of semiconductor devices arrayed on a TAB tape by using a singulation metal mold, comprising:
    disposing the TAB tape with the semiconductor devices arrayed thereon between a punch as an upper metal mold of the singulation metal mold and a die block as a lower metal mold of the singulation metal mold; and
    applying a predetermined pressure onto the singulation metal mold while the punch is engaged with the die block,
    wherein the singulation metal mold comprises,
    a knockout disposed to be slidable vertically inside a vertical hole formed in the die block, the knockout being operable to press up above the die block each of the singulated semiconductor devices left on the die block after the singulating,
    a press-up plate positioned under the knockout to support the knockout and linked mechanically to the knockout, and being operable to forcibly move the knockout vertically when the press-up plate moves vertically, and
    a press-up plate descent forcing mechanism that is operable to forcibly pull down the press-up plate.

2. The method according to claim 1, wherein:
    the press-up plate descent forcing mechanism comprises a mechanism including an elastic member one end of which is linked to the press-up plate so as to generate a repulsive force for forcibly pulling down the press-up plate as the press-up plate moves up.

3. The method according to claim 2, wherein:
    the elastic member comprises a coil spring.

* * * * *